United States Patent
Bayraktaroglu et al.

(10) Patent No.: US 9,472,649 B1
(45) Date of Patent: Oct. 18, 2016

(54) FABRICATION METHOD FOR MULTI-ZONED AND SHORT CHANNEL THIN FILM TRANSISTORS

(71) Applicant: The United States of America, as represented by the Secretary of the Air Force, Washington, DC (US)

(72) Inventors: Burhan Bayraktaroglu, Yellow Springs, OH (US); Kevin D Leedy, Dayton, OH (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 14/963,425

(22) Filed: Dec. 9, 2015

(51) Int. Cl.
   - *H01L 21/336* (2006.01)
   - *H01L 29/66* (2006.01)
   - *H01L 21/324* (2006.01)
   - *H01L 21/3065* (2006.01)
   - *H01L 21/768* (2006.01)

(52) U.S. Cl.
   CPC ..... *H01L 29/66742* (2013.01); *H01L 21/3065* (2013.01); *H01L 21/324* (2013.01); *H01L 21/76897* (2013.01)

(58) Field of Classification Search
   CPC ............. H01L 29/66765; H01L 29/78669; H01L 29/78678; H01L 29/66742; H01L 21/3065; H01L 21/324; H01L 21/76897; H01L 29/41783; H01L 29/665; H01L 29/66515
   See application file for complete search history.

(56) References Cited

U.S. PATENT DOCUMENTS

| 4,543,320 A | 9/1985 | Vijan |
| 5,532,180 A | 7/1996 | den Boer et al. |
| 5,869,360 A * | 2/1999 | Batra ............... H01L 29/66757 257/E21.413 |
| 5,872,370 A | 2/1999 | Gu et al. |
| 6,077,732 A * | 6/2000 | Sandhu ............ H01L 29/66765 257/E21.414 |
| 7,537,979 B2 | 5/2009 | Isobe et al. |
| 7,629,633 B2 | 12/2009 | Chan et al. |
| 9,147,607 B1 | 9/2015 | Bayraktaroglu |
| 2002/0013016 A1 | 1/2002 | Lee |
| 2003/0098491 A1 | 5/2003 | Tsutsumi |

FOREIGN PATENT DOCUMENTS

WO       2005045892 A2    5/2005

OTHER PUBLICATIONS

Jeon et al., "Nanometer-Scale Oxide Thin Film Transistor with Potential for High Density Image Sensor Applications," ACS Appl. Mater. Interfaces, vol. 3, p. 1-6, 2011.

* cited by examiner

*Primary Examiner* — Julio J Maldonado
*Assistant Examiner* — Stanetta Isaac
(74) *Attorney, Agent, or Firm* — AFMCLO/JAZ; Charles Figer, Jr.

(57) ABSTRACT

A method of fabricating a multi-zone, short gate length thin film transistor is provided. Gate metal and a plurality of layers are deposited on a substrate. The layers include a gate insulator, a first semiconductor, a second semiconductor, and source contact metal. An insulator is deposited on the plurality of layers partially overlapping the gate electrode and masking part of the plurality of layers. Portions of the source contact metal not masked by the insulator are removed and the first and second semiconductors are diffused with dopants via a plasma. Sidewalls of the insulator and source metal contact are covered with an insulating layer. Portions of the second semiconductor not masked are removed by etching for a length of time to create undercuts below the insulator and extending under the source contact metal. The undercuts are filled with an insulating material and an external metal contact layer is deposited.

18 Claims, 8 Drawing Sheets

FABRICATION METHOD FOR MULTI-ZONED AND SHORT CHANNEL THIN FILM TRANSISTORS

RIGHTS OF THE GOVERNMENT

The invention described herein may be manufactured and used by or for the Government of the United States for all governmental purposes without the payment of any royalty.

BACKGROUND OF THE INVENTION

1. Field of the Invention

The present invention relates to methods for forming transistors and, more particularly, to methods for forming thin film transistors.

2. Description of the Related Art

Thin film electronics are particularly useful for large area electronics that can be made over non-planar and flexible substrates. Such applications limit the fabrication to optical lithography approaches. Thin film transistors (TFT) are the basic building blocks of large area electronic circuits such as those used in the backplanes of active matrix liquid crystal displays (AMLCD) of the type often used in flat panel monitors and televisions. In these applications, TFT based circuits are used to control the activation of pixels that make up the display. In some applications, thin film circuits are produced over non-planar surfaces and in other applications they are required to be optically transparent to the visible light. Yet in other applications, they are fabricated on flexible substrates. The conventional transistors made on single crystal substrates cannot be used in these unique applications.

Historically, TFTs have been made from amorphous silicon (a-Si) films to satisfy the application requirements described above, rather than the single crystal Si as it is the case with conventional electronic circuits such as the microprocessor circuits of contemporary computers. Transistors made from a-Si, however, suffer from a number of deficiencies including low electron mobility, light sensitive operation, limited switching ratios, low current density and poor threshold voltage uniformity. Other type of thin film transistors are made from organic semiconductors. However, these types of devices have even lower electron mobility, lower current densities and poorer threshold voltage control than a-Si. These known deficiencies of a-Si and organic TFTs make them unsuitable for the current generation of display circuit applications that demand higher switching speeds and threshold voltage accuracy.

In recent years, metal-oxide semiconductors have been considered for display electronics applications. Among several metal-oxide semiconductors that are useful for thin film applications, Zn, In, Sn, Ga, and Hf containing metal-oxides have shown good promise. One of the most promising metal-oxide semiconductor for thin film and transparent transistor applications is ZnO, which is transparent because of its wide band gap (3.4 eV), has high thin film electron mobility and can be easily prepared by several deposition techniques. ZnO and related composition thin film transistors have been shown to be suitable for high performance circuit applications beyond display electronics because of their superior electronic properties. These applications include microwave signal amplification, switching and mixing, high speed logic circuits and high speed control electronics. Other metal-oxide based thin film semiconductors are also useful when they are a mixed combination of several metal-oxides. For example, indium zinc oxide (IZO) or indium gallium zinc oxide (IGZO) are ternary and quarternary compound semiconductors are being used.

The speed of thin film transistors relate directly to their gate length, which must be kept as short as possible to lower electron transport time between electrodes and improve its high frequency response characteristics. Since current density is proportional to W/L, where W is the gate width and L is the gate length, reduced gate length improves device current density capability. However, wavelength related limitations of optical lithography make it suitable only for line widths larger than 1 micrometer. Advanced and costly lithography techniques involving electron beams, phase shift techniques etc. are generally not compatible with large area electronics. These advanced lithography techniques applied to contemporary single crystal microelectronics rely on extremely well controlled substrate surface flatness and photoresist uniformity. These conditions cannot generally be maintained for thin film electronics and, therefore, large gate lengths (i.e. source-drain spacing), are typically used in thin film transistors, which limit the electronic speed of circuits to lower frequencies. This is especially true for metal oxide TFTs, whose fabrication technology maturity is less than a-Si. Additionally, short channel transistors are also useful for low voltage operation but suffer from high output conductance characteristics if the channel is uniformly doped. And, high output conductivity limits the power gain obtainable from such devices.

Figure 1:
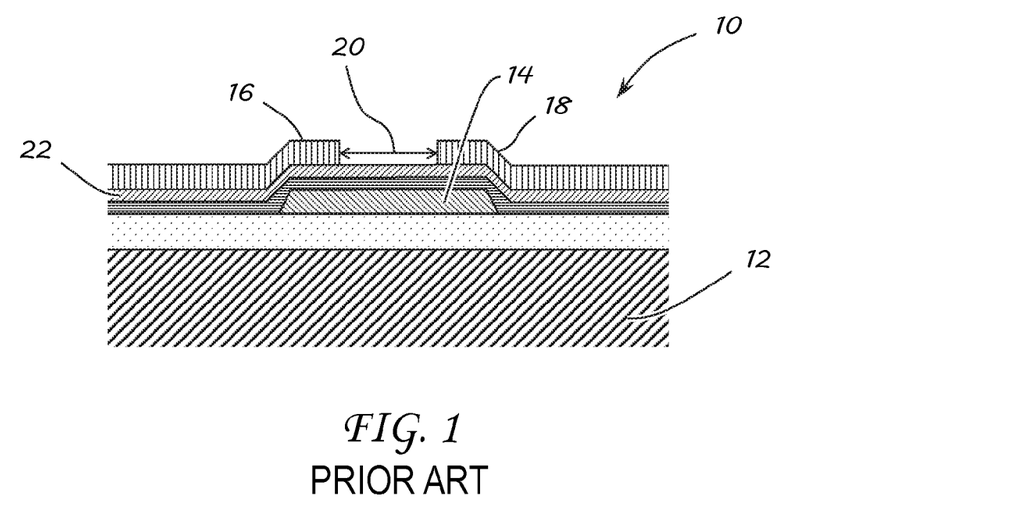
FIG. 1 is a schematic illustration of a common bottom gate thin film transistor.

In a bottom gate TFT 10, as shown schematically in FIG. 1, a first layer to be fabricated on a substrate 12 is a conductive gate metal 14. Other layers are fabricated over this layer in sequence during fabrication. Unwanted portions of each layer are removed by etching while protecting the portions of the layer with protective films such as photoresist. The most critical dimension that influences the device performance is the distance between the source 16 and the drain electrodes 18. This distance is the effective channel 20 length, as shown in FIG. 1. The composition and doping level of a semiconductor layer 22 within this channel 20 are normally kept uniform.

The gap between source 16 and drain 18 electrodes can be produced by several techniques including "lift-off" and etching. In the lift-off technique, photoresist patterns are fabricated by opening areas in the resist corresponding to the electrodes. These areas are filled with evaporated metal. Excess metal over the photoresist is removed when it is dissolved in solvent. In the etching technique, the metal layer is first produced over the entire surface by for example sputtering techniques. Photoresist patterns are then produced over the metal layer to mask areas that correspond to the electrodes. The unprotected metal surfaces are etched until all metal in these areas are removed. It is important that the etchant used to remove the metal layer does not also etch the semiconductor layer or damage its surface. In either approach, the critical dimension is the gate length. As set out above, using photolithography, the minimum gate length that can be produced is about twice the wavelength of the light used to expose the photoresist. High speed metal oxide TFTs using this technique have about 1 micrometer gate lengths. Similar size gate lengths were achieved for amorphous Si based TFTs as described in "Method of Manufacturing Semiconductor Device," U.S. Pat. No. 7,537,979 by Isobe et al.

An alternative photolithography-based fabrication method was described in "Method of Fabricating a TFT with Reduced Channel Length," U.S. Pat. No. 5,532,180 by den Boer et al. and ""TFT with Reduced Channel Length and Parasitic Capacitance," U.S. Pat. No. 5,872,370 by Gu et al.

In this approach, the source and drain electrodes are fabricated separately. By relying on positioning accuracy of the equipment, these transistor electrodes were placed closer to each other than the optical resolution of the photolithography tool. However, these approaches introduce an additional process step which can be a source of additional surface damage to the semiconductor layer. Also, the positioning approach may introduce alignment errors in both X and Y dimensions so that across the wafer there may be rotational misalignments. The minimum gate length sizes were limited to 1-4 micrometers due to these restrictions.

Other short-channel thin film transistor fabrication methods were described in "Vertical Thin Film Transistor with Short-Channel Effect Suppression," U.S. Pat. No. 7,629,633 by Chan et al. and "Method of Making a High Performance Small Area Thin Film Transistor," U.S. Pat. No. 4,543,320 by Vijan using vertical channels. Rather than relying on lithography techniques to implement a lateral separation between source and gate electrodes, this method relies on separating the source and drain electrodes vertically by stacking them and providing an insulating layer between them. Since the vertical dimensions are more easily controlled than lateral dimensions, the method can produce channel lengths smaller than a micrometer. However, the actual transistor is fabricated along the sidewalls of the contacts in substantially the vertical direction. Control of channel quality along the vertical direction is typically more challenging than the conventional horizontal surfaces.

Shorter gate lengths may also be fabricated using expensive lithography techniques such as "Leading-edge KrF Scanner" technique with special photoresists, near-field lithography, nanoimprint technology, and electron beam lithography. Although, these sophisticated lithography techniques are slow, expensive and generally not compatible with the thin film electronics produced over large area substrates.

What is needed in the art, therefore, is a method of fabricating short gate length thin film transistors without the limitations or difficulties associated with contemporary fabrication methods.

SUMMARY OF THE INVENTION

Embodiments of the invention address the need in the art by providing a method related to the design and fabrication of bottom-gated metal-oxide thin film transistors with sub-micrometer channel lengths. The method employed by the embodiments of the invention assists in avoiding the use of expensive lithography tools to fabricate such short channel transistors while providing a means to customize the channel conductivity in multiple lateral zones. The fabrication method overcomes low output resistance of short channel transistors with the use of multiple conductivity zones, which are fabricated self-aligned to the source and drain contacts. The fabrication method may be used to fabricate transistors with channels as small as a few nanometers.

Embodiments of the invention are applicable to the fabrication of ultrashort gate length metal oxide thin film transistors such as ZnO and Indium Gallium Zinc Oxide (IGZO), which are used in transparent, conformal or flexible electronic circuits. These embodiments provide a method of fabricating devices with deep sub-micrometer source-drain electrode spacing using only optical lithography. More specifically the embodiments provide methods of fabricating narrow spacing between source and drain electrodes shorter than the light wavelength used for the optical lithography.

In some embodiments having multiple zones between the source and drain, the method begins by depositing a gate metal on a substrate to form a gate electrode. A plurality of layers is deposited on the substrate and gate electrode. The layers include a gate insulating layer, a first semiconductor layer, a second semiconductor layer, and a source contact metal layer. The second semiconductor layer has a lower electrical resistivity and a higher etch rate than the first semiconductor layer. A high aspect ratio insulator is deposited on the plurality of layers. The insulator is positioned to partially overlap the gate electrode and mask a portion of the plurality of layer. Portions of the source contact metal layer not masked by the insulator are removed. Dopants are diffused in the first and second semiconductor layers not masked by the insulator by subjecting the insulator and unmasked areas of the second semiconductor layer to a plasma treatment. The second semiconductor layer acts as a retarding layer for dopant diffusion in the first semiconducting layer. Sidewalls of the insulator and remaining source metal contact layer are covered with an insulating layer. Portions of the second semiconductor layer not masked by the insulator and insulating layers on the sidewalls are removed by etching in a chemical solution. The etching is performed for a length of time to create undercuts below the insulator and insulating layers on the sidewalls and extending under the source metal contact layer. The chemical solution is selected for no or minimal etching of the first semiconductor layer. The undercuts are filled with an insulating material. Finally, an external metal contact layer is deposited.

In some embodiments with a non-insulating substrate, prior to depositing the gate metal on the substrate, an insulating layer may be deposited on the substrate. In some embodiments the first and/or second semiconductor layers may be subjected to thermal anneal cycles. In some of the embodiments, the first and second semiconductor layers may be deposited using pulsed laser deposition (PLD), sputtering, atomic layer deposition (ALD), chemical vapor deposition (CVD), chemical synthesis, or combinations of these methods. In some embodiments, the source metal contact layer may be removed by reactive ion etching. In some embodiments, the sidewalls of the insulator may be covered with the insulating layer using sputtering or plasma-enhanced chemical vapor deposition (PECVD). Adjusting the amount of undercut may be accomplished in some embodiments by shortening or lengthening the time to decrease ore increase the undercuts, respectively. In some embodiments, and prior to depositing the external metal contact layer, a via may be created in the insulator exposing a portion of the remaining source contact metal layer.

In other embodiments creating a single zone between the source and drain, the method begins by depositing a gate metal on a substrate to form a gate electrode. A plurality of layers is deposited on the substrate and gate electrode. The layers include a gate insulating layer, a first semiconductor layer, a second semiconductor layer, and a source contact metal layer. The second semiconductor layer has a lower electrical resistivity and a higher etch rate than the first semiconductor layer. A high aspect ratio insulator is deposited on the plurality of layers. The insulator is positioned to partially overlap the gate electrode and mask a portion of the plurality of layer. Portions of the source contact metal layer not masked by the insulator are removed. Sidewalls of the insulator and remaining source metal contact layer are covered with an insulating layer. Portions of the second semiconductor layer not masked by the insulator and insulating layers on the sidewalls are removed by etching in a chemical solution. The etching is performed for a length of time to create undercuts below the insulator and insulating layers on the sidewalls and extending under the source metal contact layer. The chemical solution is selected for no or minimal etching of the first semiconductor layer. The undercuts are filled with an insulating material. Finally, an external metal contact layer is deposited.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 2:
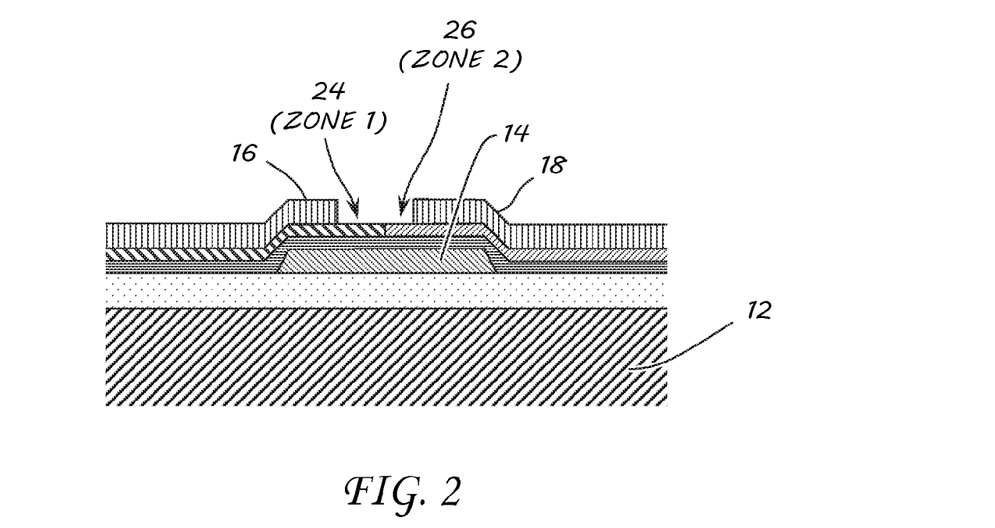
FIG. 2 is a schematic illustration of a multi-zone bottom gate thin film transistor.

Embodiments of the invention overcome the problems associated with the fabrication of short gate length metal oxide TFTs using conventional photolithography techniques. The methodology utilized in the embodiments of the invention, which relies on the fabrication of self-aligned contacts with controlled gap between them, is compatible with large area substrates. The channel length dimension is controlled by process parameters and not by lithography resolution. Additionally, within this short channel, multiple channel zones may be created with some embodiments of the invention as illustrated in FIG. 2. A zone 24 closer to the source 16 contact may contain a channel semiconductor that is undoped. While, a second zone 26 of that channel semiconductor closer to the drain contact, may be lightly doped. The lightly doped zone 26 near the drain contact absorbs some of the applied voltage and reduces the field strength in this region. This arrangement assists in overcoming the "short-channel" effect of ultra-small device designs. The "short-channel" effect refers to an effective channel length shortening as a function of the drain voltage. The net effect of this is an increase in the output conductance of the transistor. Higher output conductance negatively impacts the voltage or power gain that can be achieved from the transistor and therefore is not desirable.

An exemplary embodiment of the invention will now be described with reference to the schematic drawings in FIGS. 3-13. The transistor formed by the embodiments of the invention is preferably a bottom-gate, a.k.a. staggered gate thin film transistor using a high performance thin film of metal oxide semiconductor as an active channel region. As shown in the drawings, and similar to the configuration illustrated in FIG. 2, the channel length is reduced to sub-micrometer dimensions while providing means to control the doping levels of zones within the channel semiconductor.

Figure 3:
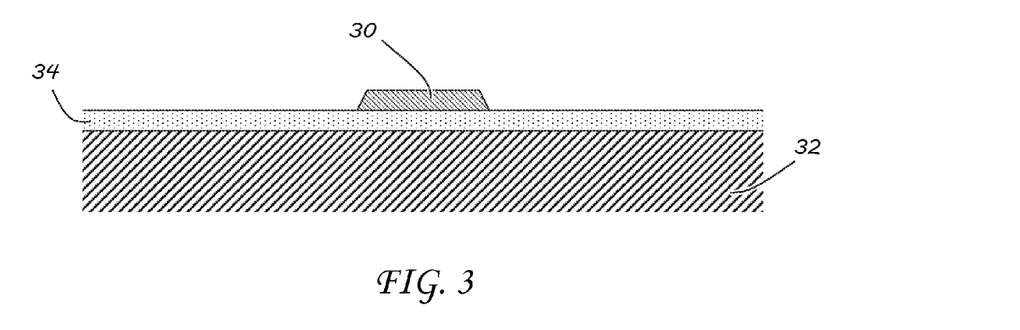
FIG. 3 is a schematic illustration of a fabrication step in constructing a multi-zone, short channel bottom gate thin film transistor.
Figure 4:
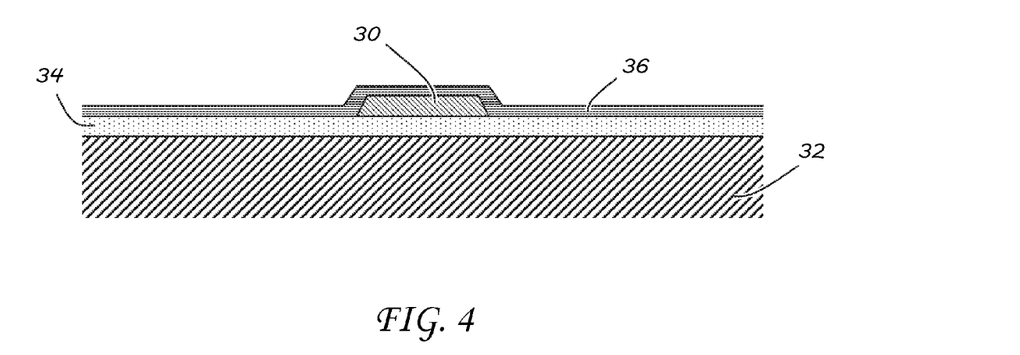
FIG. 4 is a schematic illustration of another fabrication step in constructing the multi-zone, short channel bottom gate thin film transistor.
Figure 5:
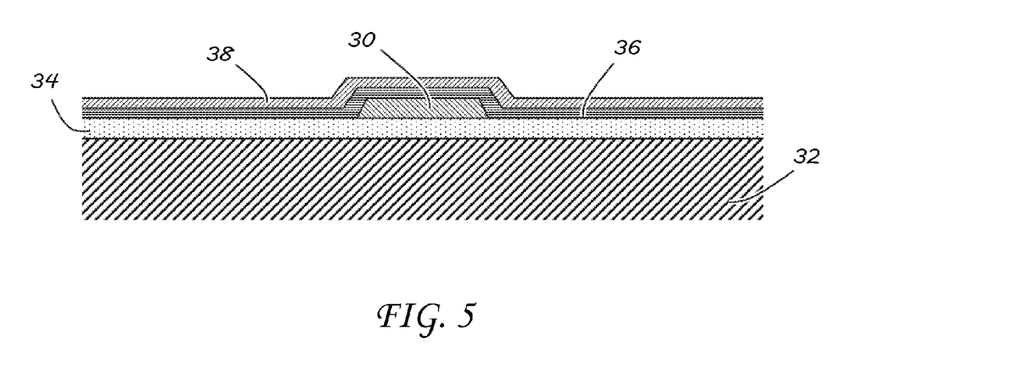
FIG. 5 is a schematic illustration of another fabrication step in constructing the multi-zone, short channel bottom gate thin film transistor.
Figure 6:
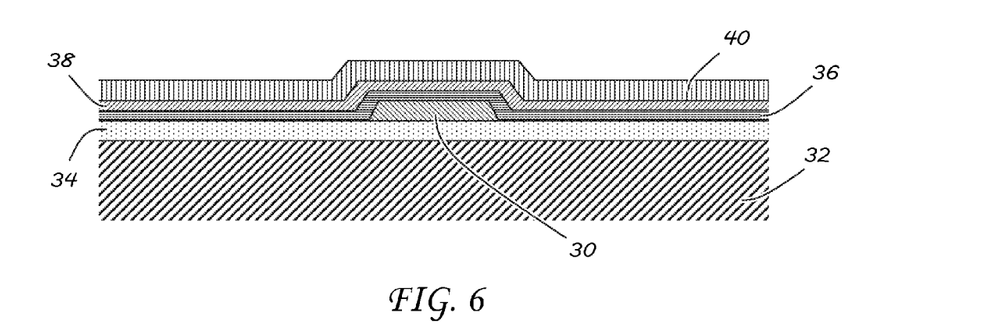
FIG. 6 is a schematic illustration of another fabrication step in constructing the multi-zone, short channel bottom gate thin film transistor.
Figure 7:
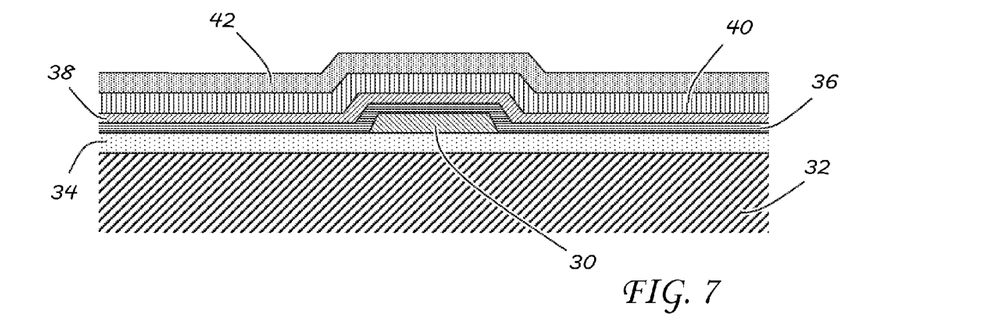
FIG. 7 is a schematic illustration of another fabrication step in constructing the multi-zone, short channel bottom gate thin film transistor.

A gate electrode 30 is first fabricated on the substrate 32 by conventional methods. The gate metal may be Al, Au, Ni, Mo, W, TiW, Cr, or any other such metals typically used in the semiconductor industry or multiple layers of such metals. The substrate 32 may be rigid or flexible. It may also be opaque or transparent. The substrate 32 can be made of silicon, germanium, gallium arsenide, indium phosphide, sapphire, SiC, GaN, soda lime glass, glass, quartz, other semiconductors, plastic or stainless steel. The gate electrode 30 may be fabricated directly on the substrate 32 if the substrate 32 is insulating. Otherwise, a thin layer of insulator 34 can be placed on the substrate 32 before the fabrication of the gate electrode 30, as shown in FIG. 3. A width of this electrode is slightly larger than dimensions of the source-drain gap. In this and other figures, the gate electrode 30 width is exaggerated for clarity.

A series of layers are produced on the gate electrode 30 and the substrate 32 as shown in FIGS. 4-7. These layers are the gate insulator 36 in FIG. 4, semiconductor layer(s) 38, 40 in FIGS. 5 and 6, and a source contact metal layer 42 in FIG. 7. The gate insulator 36 layer may be made of inorganic materials such as $SiO_2$, $Al_2O_3$, $HfO_2$, $ZrO_2$ etc. or organic materials such as polyimide or other films commonly used in microelectronics to isolate the gate electrode 30 from the semiconductor channel. The semiconductor layers 38, 40 may be made from metal oxide semiconductors based on Zn, In, Ga, and Hf. They can be simple binary compound such as ZnO or an alloy of various metal oxides, such as indium gallium zinc oxide (IGZO). The semiconductor films may be deposited by a range of techniques including pulsed laser deposition (PLD), sputtering, atomic layer deposition (ALD), chemical vapor deposition (CVD), chemical synthesis etc. These layers may be used as-deposited or may be subjected to thermal anneal cycles to improve their physical and electrical properties. In the illustrated embodiment, two layers 38, 40 of semiconductors are used, though other embodiments may have single semiconducting layer. The first semiconductor layer 38 is adjacent to the gate insulator 36 and used as a main channel semiconductor. The second semiconductor layer 40 is placed on top of the first semiconductor 38. The second semiconductor 40 has a low electrical resistivity by incorporating high levels of dopants. The second semiconductor is also chosen such that it has a much higher etch rate in chemical solutions than the first semiconductor. In the illustrated embodiment, the first semiconductor layer 38 is made of undoped indium gallium zinc oxide (IGZO) and the second semiconductor layer 40 is made of gallium doped zinc oxide (GZO). The thicknesses of the semiconductor layers are 50 nm, though other thicknesses may also be used ranging from 10 nm to 500 nm. The source contact metal layer 42 is made of a refractory metals such as W, TiW, Mo, or other metals that can be selectively etched. This contact layer 42 may also be a transparent conductive layer such as indium doped tin oxide (ITO). In the illustrated embodiment, the material for the source contact metal layer is TiW with a thickness of 75 nm, but other thickness values may be used ranging from 25 nm to 1,000 nm.

Figure 8:
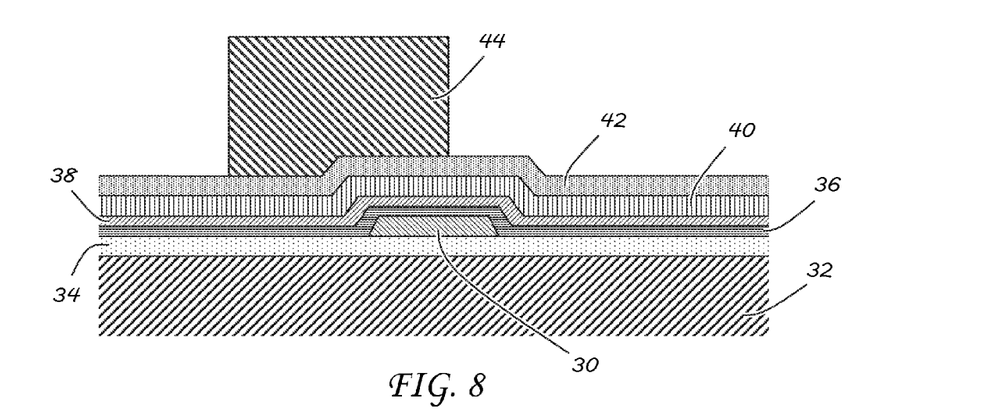
FIG. 8 is a schematic illustration of another fabrication step in constructing the multi-zone, short channel bottom gate thin film transistor.
Figure 9:
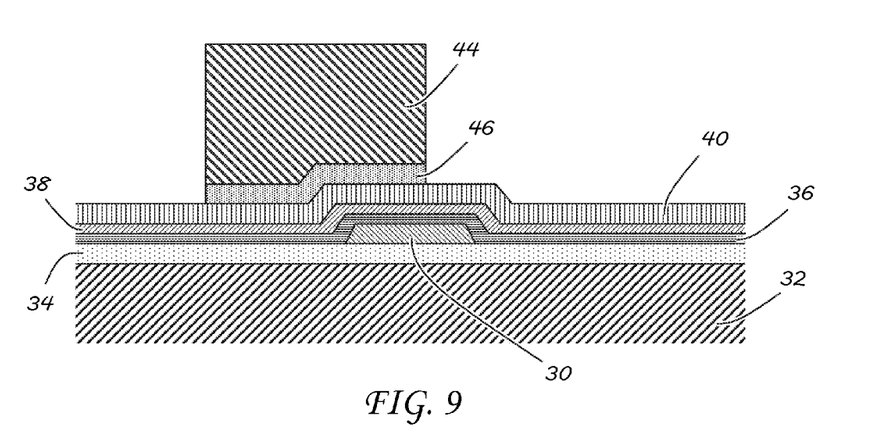
FIG. 9 is a schematic illustration of another fabrication step in constructing the multi-zone, short channel bottom gate thin film transistor.

The source contact areas are masked by an insulating layer 44, as shown in FIG. 8. The masking material is preferably a high temperature organic material such as polyimide (PI), PMGI, or SU-8, which can be fabricated with high aspect ratios (i.e. steep sidewalls). In the illustrated embodiment, a 650 nm thick SU-8 masking layer was employed. SU-8 is a photosensitive high temperature organic material. The next step is to remove all source metal contact layer 42 that is not protected by the masking material 44. This can be accomplished in a plasma reactor such as reactive ion etching (RIE) system to remove the contact layer without etching the underlying semiconductor material, as shown in FIG. 9. In the illustrated embodiment, the source metal contact layer (TiW) 42 is removed in a RIE system with SF6 plasma as is known in the art, resulting in the formation of a source contact 46.

Figure 10:
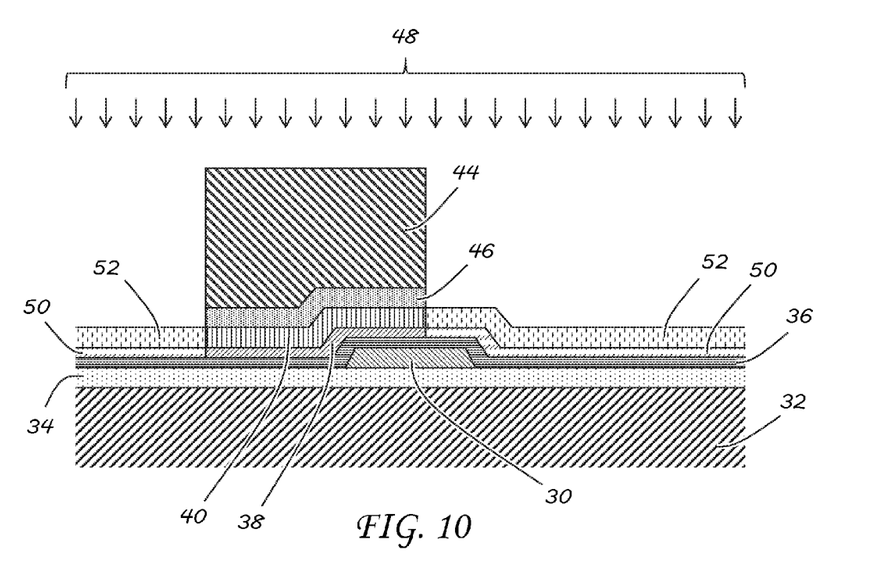
FIG. 10 is a schematic illustration of the fabrication steps in FIGS. 3-9 being treated with a plasma.

The surface of the semiconductor layers 38, 40 may, in some embodiments, be subjected to a plasma treatment 48, as illustrated in FIG. 10, to cause an increase in layer conductivity by incorporating dopants or by changing the stoichiometry of the layer composition resulting in modified semiconductor layers 50, 52 respectively. Plasma of gasses such as He, H, N, or Ar may be used for this purpose. Plasma of other gasses that contain these gasses may also be used (e.g. $SiH_4$). The gas utilized in the exemplary embodiment is He with plasma conditions of 100 W RF power, 40 mTorr pressure, and 40 sccm gas flow rate. Many of the metal oxide semiconductors used for this application will rapidly incorporate dopants and become highly conductive. The incorporated dopant concentration is dependent on the depth so that the first semiconductor 38 conductivity is increased only modestly whereas the conductivity of the second semiconductor 40 increases substantially. The second semiconductor 40 acts as a retarding layer for the dopant diffusion so that the first semiconductor 38 can be lightly doped. A dopant concentration of about $1-20\times10^{17}$ $cm^{-3}$ is preferred for use with application of some embodiments of the invention. Without the retarding effect of the second semiconductor, the dopant levels could be more than $1\times10^{19}$ $cm^{-3}$, which will convert this layer from a semiconducting to a highly conducting layer.

Figure 11:
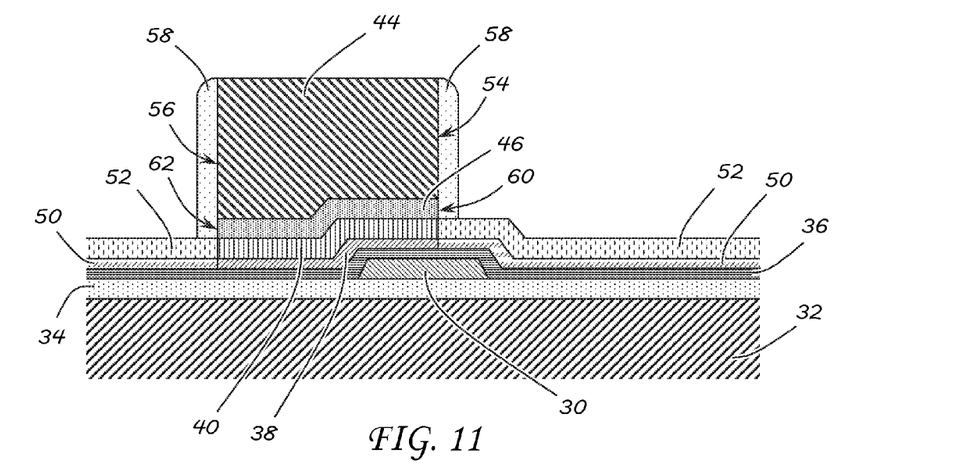
FIG. 11 is a schematic illustration of another fabrication step in constructing the multi-zone, short channel bottom gate thin film transistor.

Sidewalls 54, 56 of the masking layer 44 are covered with an insulating layer 58 using the well-known sidewall fabrication techniques as illustrated in FIG. 11. This technique involves the deposition of an insulator such as $SiO_2$, $Si_3N_4$, etc. conformably over the surface using techniques such as sputtering or PECVD. Almost all the deposited layer is then removed in an anisotropic etchant so that only the layers 58 covering the vertical sidewalls remain. In the illustrated embodiment, a 300 nm thick $SiO_2$ was deposited using PECVD and subsequently etched in $CF_4$ and $O_2$ plasma in RIE. This produced a sidewall with a footprint of 150 nm on the second semiconductor layer. Other thicknesses may be used for different footprint dimensions. The insulator 58 on the sidewalls 54, 56 seals edges 60, 62 of the source contact 46 as shown in FIG. 11.

Figure 12:
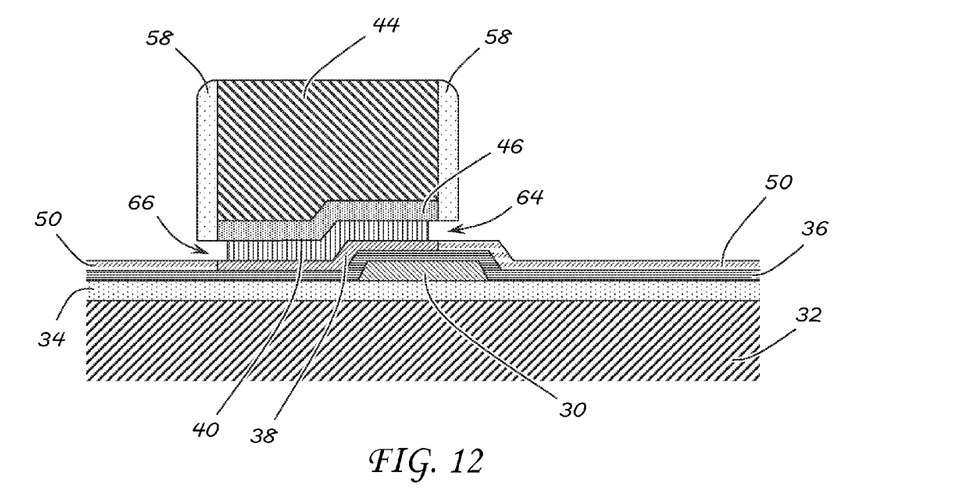
FIG. 12 is a schematic illustration of another fabrication step in constructing the multi-zone, short channel bottom gate thin film transistor.

Portions of the doped second semiconductor 52 not covered by the mask 44 and the sidewall 58 is etched in a chemical solution to create undercuts 64, 66. The etchant solution is chosen to preferentially etch the doped second semiconductor 52 with no or minimal etching of the doped first semiconductor 50. In the illustrated embodiment, a weak solution of HCl is used to remove the doped second semiconductor 52, i.e. GZO. A suitable dilution of HCl in water for this purpose is 1 part HCl in 5,000 part water. Undercut dimensions of 0 to 1000 nm may be implemented by adjusting the etch time and temperature. For example, undercut dimension of 200 nm can be produced by etching for 1 min at room temperature. During this time, less than 1 nm of the first semiconductor material is etched. Note that for the creation of 2 doping zones in the channel of the transistor, the undercut dimension should be more than the sidewall footprint dimension. The amount of undercut below the source metal defines the size of Zone 1 whereas the dimension of the sidewall footprint defines the size of Zone 2, as shown in FIG. 12.

Figure 13:
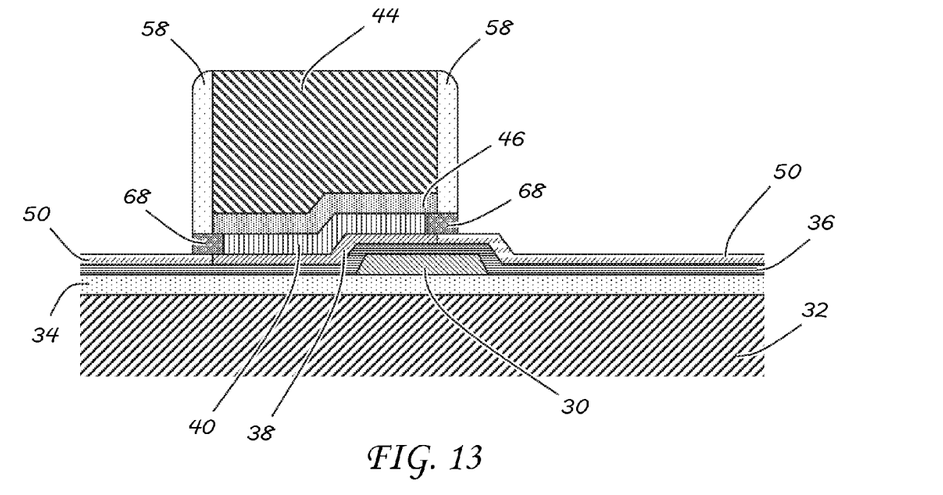
FIG. 13 is a schematic illustration of another fabrication step in constructing the multi-zone, short channel bottom gate thin film transistor.

The undercut regions 64, 66 are protected with the use of an underfill 68, as shown in FIG. 13. The filling material is preferably electrically insulating and provides physical protection to Zone 1 and Zone 2 of the active device channel. It also serves as a surface passivation layer. Fill material utilized in the illustrated embodiment is PMGI, which is photosensitive high temperature polymer. It can be applied in liquid form so the undercut areas can be filled effectively. After curing the applied fill material it is exposed to UV light. The exposed portions are removed in a developer solution. The fill material in the undercut region is masked from the UV light and therefore is not removed by the developer.

Figure 14:
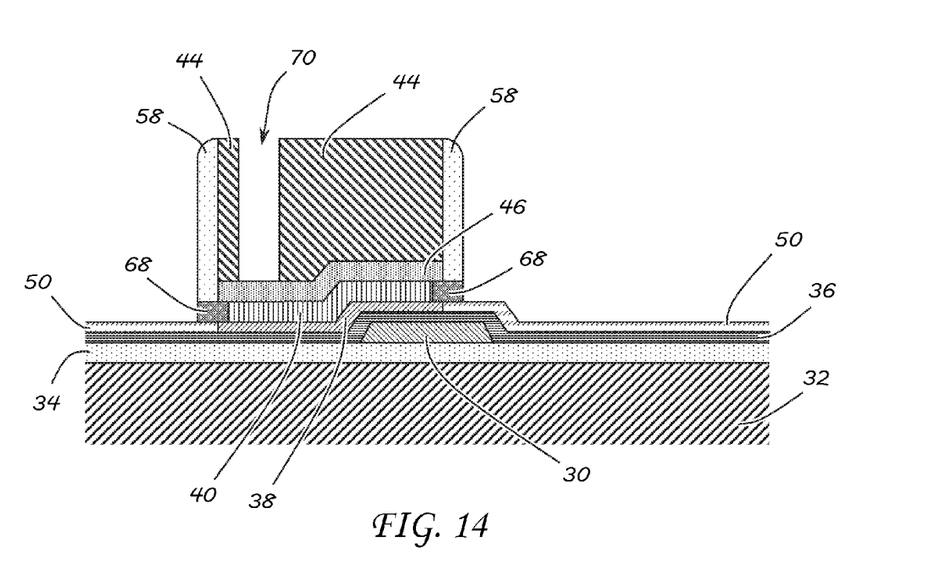
FIG. 14 is a schematic illustration of another fabrication step in constructing the multi-zone, short channel bottom gate thin film transistor.
Figure 15:
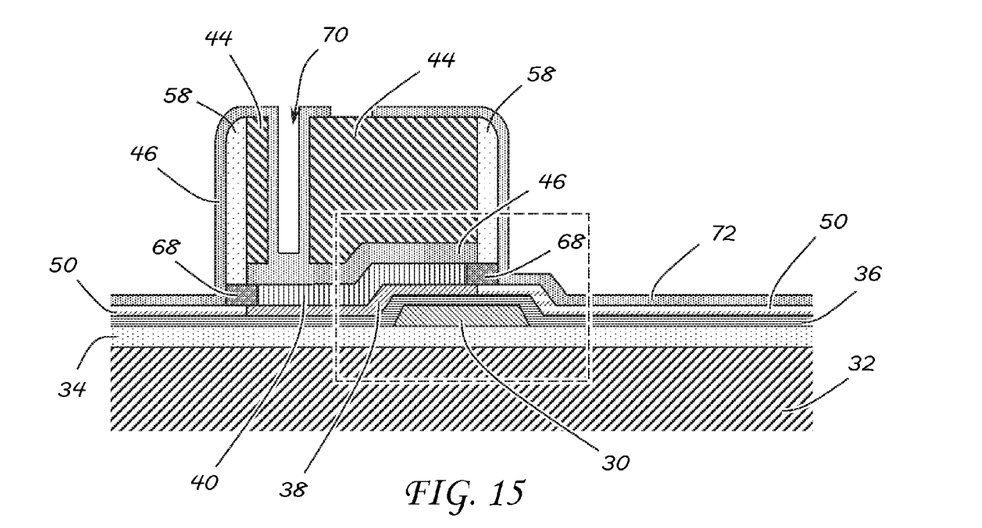
FIG. 15 is a schematic illustration of a final fabrication step and a resulting multi-zone, short channel bottom gate thin film transistor.
Figure 15A:
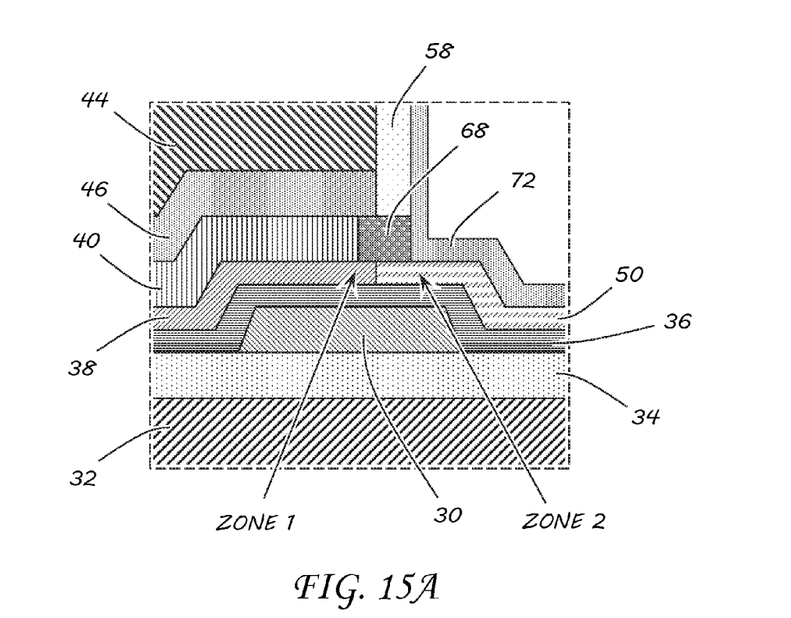
FIG. 15A is a zoomed area of the resulting multi-zone, short channel bottom gate thin film transistor of FIG. 15.

A via 70 is created in the masking layer 44 to the source contact 46. The via 70 is created in the illustrated embodiment using RIE as seen in FIG. 14. Other embodiments may contain creation of additional vias where there are layers covering the source 46 and the gate contacts 30 outside the views of these cross sectional drawings. Finally, external contact metallization is applied. This step is not unique to the invention and it can be done in several different ways using the technologies commonly applied in the semiconductor manufacturing. In the illustrated embodiment, TiW layer is applied to the whole surface via sputtering. Using photoresist masks, unwanted portions of the TiW layer are removed in RIE. And finally, the photoresist layer is stripped off in solvents. The final structure of the device is shown in FIG. 15. FIG. 15A illustrates the details of the multi-zone short gate length structure.

Figure 16:
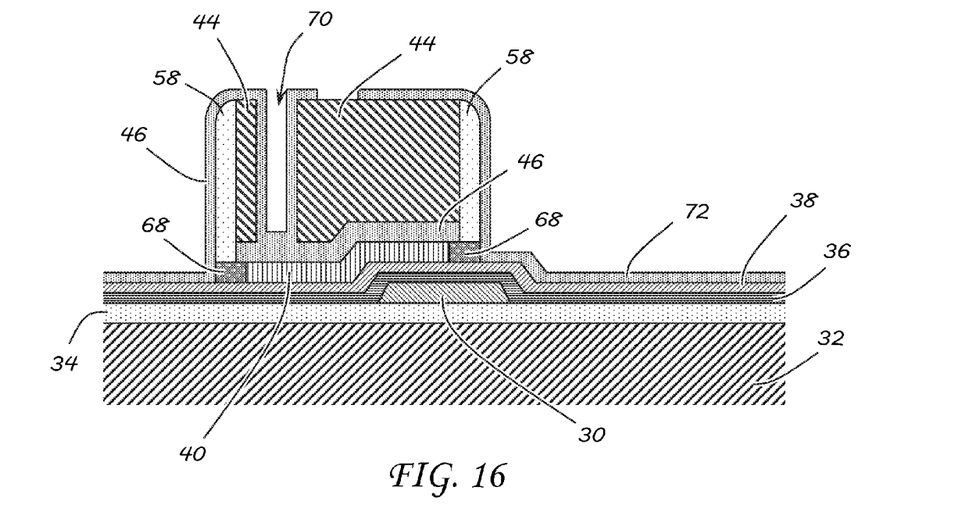
FIG. 16 is a schematic illustration of a resulting single-zone, short channel bottom gate thin film transistor.

In alternate embodiments and without deviating from the design and fabrication methods described by the embodiments above, other device types may also be implemented by selecting process sequences. For example, if the plasma surface treatment step is excluded from the process sequence, the resulting device will have a single zone channel region as illustrated in FIG. 16.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. For example, some of the embodiments of the invention provide a method of fabricating short channel transistors that also have multiple conductivity zones along the channel to improve the output conductance. The significance of these embodiments is the simultaneous fabrication of short channel and multiple channel doping zones within that short channel in a self-aligned fashion. The invention in its broader aspects is therefore not limited to the specific details, representative apparatus and method, and illustrative examples shown and described. Accordingly, departures may be made from such details without departing from the scope of the general inventive concept.

What is claimed is:

1. A method of fabricating a multi-zone, short gate length thin film transistor, the method comprising:
   depositing a gate metal on a substrate to form a gate electrode;
   depositing a plurality of layers on the substrate and gate electrode, the layers including a gate insulating layer, a first semiconductor layer, a second semiconductor layer, and a source contact metal layer, the second semiconductor layer having a lower electrical resistivity and a higher etch rate than the first semiconductor layer;
   depositing a high aspect ratio insulator on the plurality of layers, the insulator positioned to partially overlap the gate electrode and mask a portion of the plurality of layers;
   removing portions of the source contact metal layer not masked by the insulator;
   diffusing dopants in the first and second semiconductor layers not masked by the insulator by subjecting the insulator and areas of the second semiconductor layer not masked by the insulator to a plasma treatment, the second semiconductor layer acting as a retarding layer for dopant diffusion in the first semiconducting layer;
   covering sidewalls of the insulator and a remaining source metal contact layer with an insulating layer;
   removing portions of the second semiconductor layer not masked by the insulator and insulating layers on the sidewalls by etching in a chemical solution, the etching performed for a length of time to create undercuts below the insulator and insulating layers on the sidewalls and extending under the remaining source contact metal layer, the chemical solution selected for no or minimal etching of the first semiconductor layer;
   filling the undercuts with an insulating material; and
   depositing an external metal contact layer.

2. The method of claim 1, further comprising:
   prior to depositing the gate metal on the substrate, depositing an insulating layer on the substrate.

3. The method of claim 1, further comprising:
   subjecting at least one of the first and second semiconductor layers to thermal anneal cycles.

4. The method of claim 1, wherein the first and second semiconductor layers are deposited using pulsed laser deposition (PLD), sputtering, atomic layer deposition (ALD), chemical vapor deposition (CVD), chemical synthesis, and combinations thereof.

5. The method of claim 1, wherein the source metal contact layer is removed by reactive ion etching.

6. The method of claim 1, wherein the sidewalls of the insulator are covered with the insulating layer using sputtering or plasma-enhanced chemical vapor deposition (PECVD).

7. The method of claim 1, wherein the length of time is shorted to decrease the undercuts.

8. The method of claim 1, wherein the length of time is lengthened to increase the undercuts.

9. The method of claim 1, further comprising:
   prior to depositing the external metal contact layer, creating a via in the insulator exposing a portion of the remaining source contact metal layer.

10. A method of fabricating a multi-zone, short gate length thin film transistor, the method comprising:
    depositing a gate metal on a substrate to form a gate electrode;
    depositing a plurality of layers on the substrate and gate electrode, the layers including a gate insulating layer, a first semiconductor layer, a second semiconductor layer, and a source contact metal layer, the second semiconductor layer having a lower electrical resistivity and a higher etch rate than the first semiconductor layer;
    depositing a high aspect ratio insulator on the plurality of layers, the insulator positioned to partially overlap the gate electrode and mask a portion of the plurality of layers;
    removing portions of the source contact metal layer not masked by the insulator;
    covering sidewalls of the insulator and a remaining source metal contact layer with an insulating layer;
    removing portions of the second semiconductor layer not masked by the insulator and insulating layers on the sidewalls by etching in a chemical solution, the etching performed for a length of time to create undercuts below the insulator and insulating layers on the sidewalls and extending under the remaining source contact metal layer, the chemical solution selected for no or minimal etching of the first semiconductor layer;
    filling the undercuts with an insulating material; and
    depositing an external metal contact layer.

11. The method of claim 10, further comprising:
    prior to depositing the gate metal on the substrate, depositing an insulating layer on the substrate.

12. The method of claim 10, further comprising:
subjecting at least one of the first and second semiconductor layers to thermal anneal cycles.

13. The method of claim 10, wherein the first and second semiconductor layers are deposited using pulsed laser deposition (PLD), sputtering, atomic layer deposition (ALD), chemical vapor deposition (CVD), chemical synthesis, and combinations thereof.

14. The method of claim 10, wherein the source metal contact layer is removed by reactive ion etching.

15. The method of claim 10, wherein the sidewalls of the insulator are covered with the insulating layer using sputtering or plasma-enhanced chemical vapor deposition (PECVD).

16. The method of claim 10, wherein the length of time is shorted to decrease the undercuts.

17. The method of claim 10, wherein the length of time is lengthened to increase the undercuts.

18. The method of claim 10, further comprising:
prior to depositing the external metal contact layer, creating a via in the insulator exposing a portion of the remaining source contact metal layer.

* * * * *